(12) United States Patent
Ho et al.

(10) Patent No.: US 11,245,411 B2
(45) Date of Patent: Feb. 8, 2022

(54) RECEIVER AND ASSOCIATED SIGNAL PROCESSING METHOD

(71) Applicant: Realtek Semiconductor Corp., HsinChu (TW)

(72) Inventors: Hsuan-Ting Ho, Taichung (TW); Chi-Shun Weng, Hsinchu County (TW); Liang-Wei Huang, Hsinchu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/004,007

(22) Filed: Aug. 27, 2020

(65) Prior Publication Data
US 2021/0091776 A1    Mar. 25, 2021

(30) Foreign Application Priority Data
Sep. 23, 2019    (TW) ................ 108134186

(51) Int. Cl.
*H03M 1/06*     (2006.01)
*H03M 1/08*     (2006.01)
(Continued)

(52) U.S. Cl.
CPC ............... *H03M 1/08* (2013.01); *H04B 1/16* (2013.01); *H04L 5/14* (2013.01)

(58) Field of Classification Search
CPC ...... H03M 1/08; H03M 13/256; H03M 13/41; H03M 13/6331; H03M 1/1255; H04B 1/16; H04B 3/23; H04B 3/32; H04B 10/697; H04L 5/14; H04L 1/0054; H04L 1/242; H04L 2025/03363; H04L 2025/03369; H04L 2025/03477; H04L 2025/0349; H04L 2025/03496; H04L 2025/03503; H04L 2025/03585; H04L 2025/03611; H04L 2025/03617; H04L 2025/03745;
(Continued)

(56) References Cited

U.S. PATENT DOCUMENTS 7,330,141 B2 * 2/2008 Temerinac .......... H03M 1/1042
                                                            341/120
7,839,758 B1 * 11/2010 Gregorian ................ H04B 3/23
                                                            370/201
(Continued)

FOREIGN PATENT DOCUMENTS

WO        03/053019 A2     6/2003

*Primary Examiner* — Linh V Nguyen
(74) *Attorney, Agent, or Firm* — Winston Hsu

(57) ABSTRACT

The present invention provides a receiver including an ADC, an echo-cancellation circuit and a control circuit. In the operations of the receiver, the ADC uses a clock signal to perform an analog-to-digital converting operation on an analog input signal to generate digital input signal, the echo-cancellation circuit refers to a plurality of tap coefficients to perform an echo-cancellation operation on the digital input signal to generate an output signal, and the control circuit is configured to control a phase of the clock signal inputted into the ADC. In addition, when the phase of the clock signal is adjusted, the control circuit calculates a plurality of updated tap coefficients according to the plurality of tap coefficients used by the echo-cancellation circuit in a previous time, for use of the echo-cancellation circuit.

18 Claims, 5 Drawing Sheets

(51) Int. Cl.
*H04B 1/16* (2006.01)
*H04L 5/14* (2006.01)

(58) Field of Classification Search
CPC ........... H04L 25/0264; H04L 25/03038; H04L 25/03057; H04L 25/03146; H04L 25/03267; H04L 25/03987; H04L 25/067; H04L 25/14; H04L 25/4917; H04L 25/497; H04L 7/0062; H04L 7/0334; H04L 25/03878
USPC .................................................. 341/118–121
See application file for complete search history.

(56) References Cited

U.S. PATENT DOCUMENTS

| | | | |
|---|---|---|---|
| 2001/0055331 A1* | 12/2001 | Agazzi | H04B 3/235 375/216 |
| 2003/0138038 A1* | 7/2003 | Greiss | H04L 1/0054 375/232 |
| 2004/0013208 A1* | 1/2004 | Bui | H04L 25/0202 375/316 |
| 2005/0099967 A1* | 5/2005 | Baba | H04B 3/23 370/286 |
| 2006/0256849 A1* | 11/2006 | Tseng | H04L 25/0307 375/232 |
| 2008/0198051 A1* | 8/2008 | Tanimura | H04L 7/007 341/137 |
| 2010/0290333 A1* | 11/2010 | Lin | H04B 3/32 370/201 |
| 2010/0309963 A1 | 12/2010 | Agazzi | |
| 2015/0117656 A1* | 4/2015 | Abe | H04B 3/232 381/66 |

* cited by examiner

RECEIVER AND ASSOCIATED SIGNAL PROCESSING METHOD

BACKGROUND OF THE INVENTION

1. Field of the Invention

The present invention relates to a receiver, and more particularly, to a receiver having an echo-cancellation circuit.

2. Description of the Prior Art

In a full-duplex ethernet system, since a transmission line has both a transmission signal and a reception signal, if the transmission line has an impedance mismatch or a receiver and the relevant circuits have a mismatch issue, some signal components in the transmission signal are reflected into the receiving path, and the reflected signal components are generally called echo signals. Because the high-frequency components of transmission signals are usually difficult to penetrate and easily to be reflected back, the above-mentioned echo signals will be mostly high-frequency components, resulting in the effective bandwidth of the echo signals usually not less than half of the frequency of the clock signals used by the receiver. Therefore, aliasing will occur when the echo signals returns to the receiver and the receiver uses the clock signal to sample the echo signals.

In order to reduce the effect of the echo signal, the receiver adjusts the phase of the clock signal to perform a sampling operation or an analog-to-digital conversion operation on the echo signal to obtain the frequency response of the digital echo signal at different clock signal phases, for the relevant circuits to determine the optimal phase of the clock signal. Generally, in order to avoid affecting the quality of the received signal, the phase adjustment of the clock signal is usually very small, for example, the phase adjustment amount can be ($\frac{1}{1024}$) of a period of the clock signal. However, this method significantly increases the cost of a phase selector in analog circuits.

SUMMARY OF THE INVENTION

It is therefore an objective of the present invention to provide a receiver, in which the clock signal can have a larger phase adjustment amount, such as ($\frac{1}{128}$) of the period of the clock signal, without influencing the quality of the received signal, to solve the above-mentioned problems.

According to one embodiment of the present invention, a receiver comprising an analog-to-digital converter (ADC), an echo-cancellation circuit and a control circuit is disclosed. In the operations of the receiver, the ADC uses a clock signal to perform an analog-to-digital converting operation on an analog input signal to generate digital input signal, the echo-cancellation circuit refers to a plurality of tap coefficients to perform an echo-cancellation operation on the digital input signal to generate an output signal, and the control circuit is configured to control a phase of the clock signal inputted into the ADC. In addition, when the phase of the clock signal is adjusted, the control circuit calculates a plurality of updated tap coefficients according to the plurality of tap coefficients used by the echo-cancellation circuit in a previous time, for use of the echo-cancellation circuit.

According to another embodiment of the present invention, a signal processing method comprises the steps of: using a clock signal to perform an analog-to-digital converting operation on an analog input signal to generate a digital input signal; referring to a plurality of tap coefficients to perform an echo-cancellation operation on the digital input signal to generate an output signal; controlling a phase of the clock signal inputted into the ADC; and when the phase of the clock signal is adjusted, calculating a plurality of updated tap coefficients according to the plurality of tap coefficients used in a previous time, for use of the echo-cancellation operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
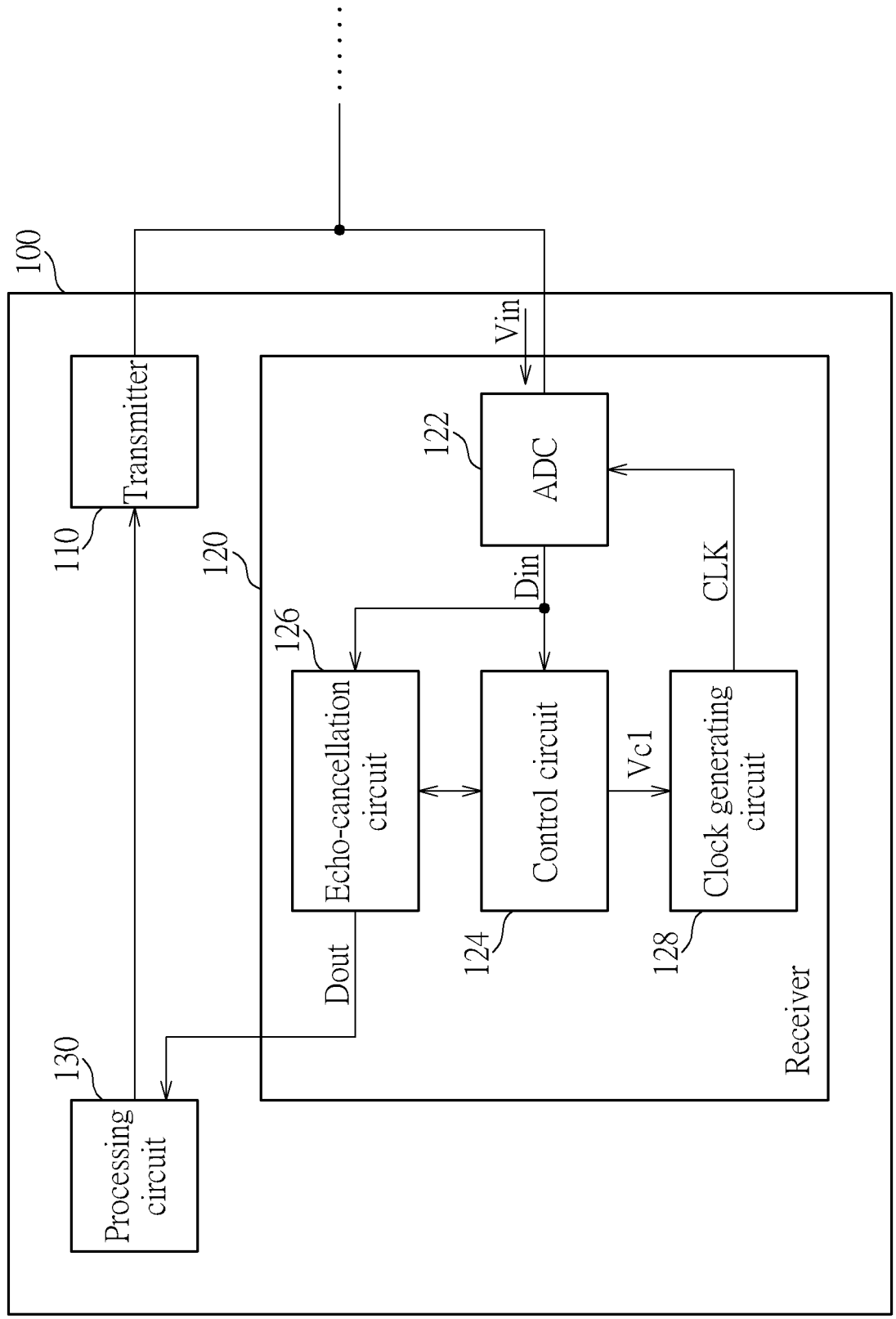
FIG. 1 is a diagram illustrating a chip applied to a full-duplex ethernet system according to one embodiment of the present invention.

FIG. 1 is a diagram illustrating a chip 100 applied to a full-duplex ethernet system according to one embodiment of the present invention. As shown in FIG. 1, the chip 100 comprises a transmitter 110, a receiver 120 and a processing circuit 130, wherein the receiver 120 comprises an ADC 122, a control circuit 124, an echo-cancellation circuit 126 and a clock generating circuit 128.

When the chip 100 is in operation, the processing circuit 130 transmits data to another electronic device outside the chip 100. At this time, the processing circuit 130 first transmits the data to the transmitter 110 to generate a transmission signal to the other electronic device via a transmission line. If the impedance of the transmission line does not match, some of the signal components of the transmission signal are reflected back into the receiving path and become an echo signal. Therefore, the analog input signal Vin received by the receiver 120 contains data from the other electronic device in addition to the echo signal, especially this echo signal is usually a high frequency signal that may degrade the signal quality. In order to reduce the influence of the echo signal, the control circuit 124 in the receiver 120 generates a control signal Vc1 to the clock generating circuit 128 to adjust the phase of the clock signal CLK, wherein the adjusted clock signal CLK is used by the ADC 122 to perform the sampling operation and the analog-to-digital converting operation on the analog input signal Vin to generate a digital input signal Din. The control circuit 124 further obtains the frequency responses of the clock signal CLK at different phases according to the digital input signal Din, as a basis for the phase adjustment of the clock signal CLK. At the same time, the echo-cancellation circuit 126 performs an echo-cancellation operation on the digital input signal Din to generate an output signal Dout. On the other hand, in order to reduce the manufacturing cost of the clock generating circuit 128, the clock signal CLK will have a larger phase adjustment amount. For example, each time the phase adjustment of the clock signal CLK is performed, the phase adjustment amount is one-128th of the period of the clock signal. However, due to the large phase adjustment amount, the digital input signal Din will also change greatly at the time point when the phase of the clock signal CLK is adjusted. In the case where the tap coefficients in the echo-cancellation circuit 126 are not updated quickly, the SNR of the output signal Dout will be reduced. In order to solve this problem, the present invention proposes a method that can predict the tap coefficients required in the echo-cancellation circuit 126, which can quickly update the tap coefficients of the echo-cancellation circuit 126 when the phase of the clock signal CLK is updated, to avoid affecting the signal quality of the output signal Dout.

It should be noted that, because the mechanism for controlling the phase of the clock signal CLK for use by the ADC 122 and the circuit architecture of the echo-cancellation circuit 126 (for example, including an active filter to use tap coefficients for performing filtering operation) are known by a person skilled in the art, and the focus of the present invention is how to generate updated tap coefficients for use by the echo-cancellation circuit 126, so the control of the clock generating circuit 128 and the detailed circuit of the echo-cancellation circuit 126 are omitted here.

Figure 2:
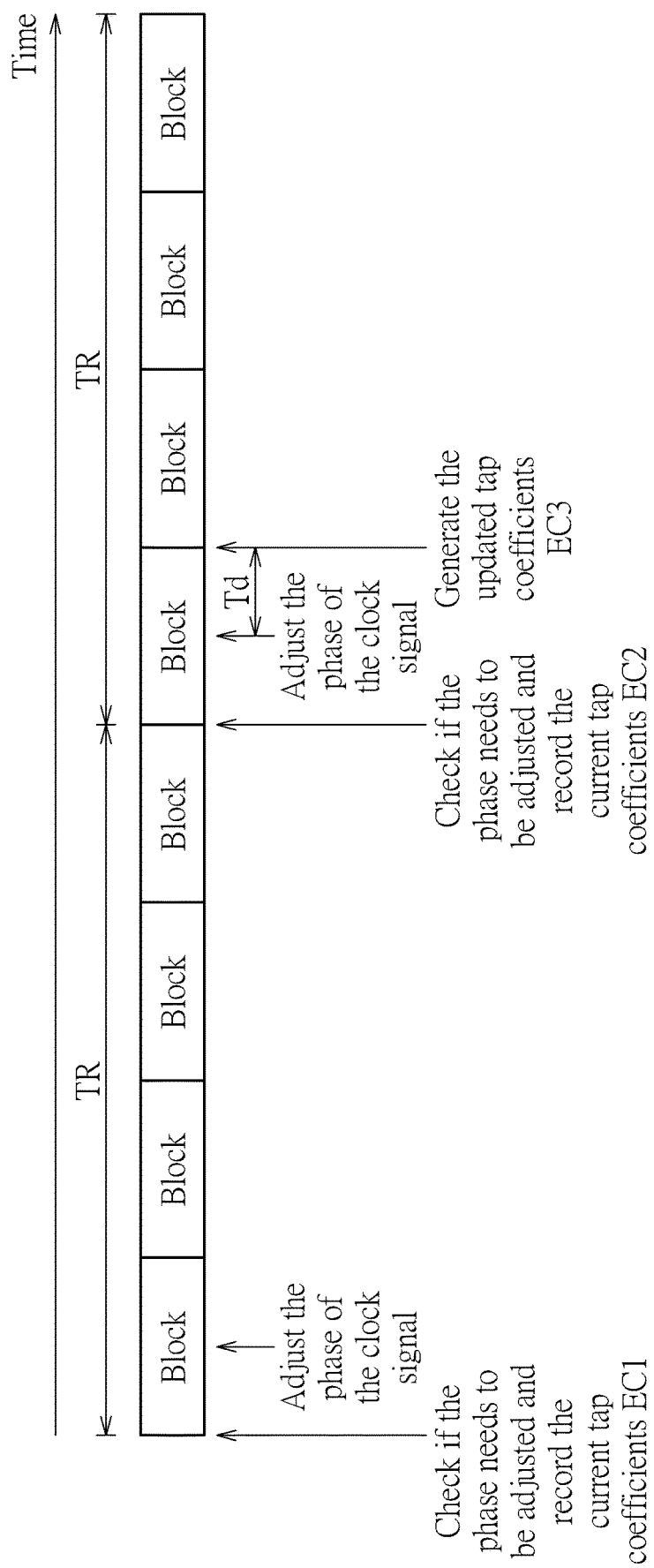
FIG. 2 shows a phase adjustment of a clock signal and updating tap coefficients according to one embodiment of the present invention.

Refer to the diagram of phase adjustment and updating tap coefficients shown in FIG. 2, wherein each block shown in FIG. 2 can be amount of data of the digital input signal Din over a period of time or a processing unit after Fast Fourier Transform (FFT). In FIG. 2, when the echo-cancellation circuit 126 starts processing the first block, the control circuit 124 checks whether the phase of the clock signal CLK needs to be adjusted. If the phase of the clock signal CLK needs to be adjusted, firstly, the control circuit 124 records the plurality of tap coefficients currently used by the echo-cancellation circuit 126 as a plurality of first tap coefficients EC1, and then the control circuit 124 generates the control signal Vc1 to the clock generating circuit 128 to adjust the phase of the clock signal CLK. In this embodiment, it is assumed that the phase adjustment of the clock signal CLK is performed for the first time, therefore, after the phase of the clock signal CLK is adjusted, the echo-cancellation circuit 126 uses its adaptive algorithm to update and adjust the internal tap coefficients to effectively perform echo-cancellation on the digital input signal Din. In addition, in order to prevent the phase of the clock signal CLK from being adjusted after convergence and stabilization, the control circuit 124 sets a minimum delay time TR for the phase adjustment of the clock signal CLK to reduce unnecessary phase adjustments.

Figure 3:
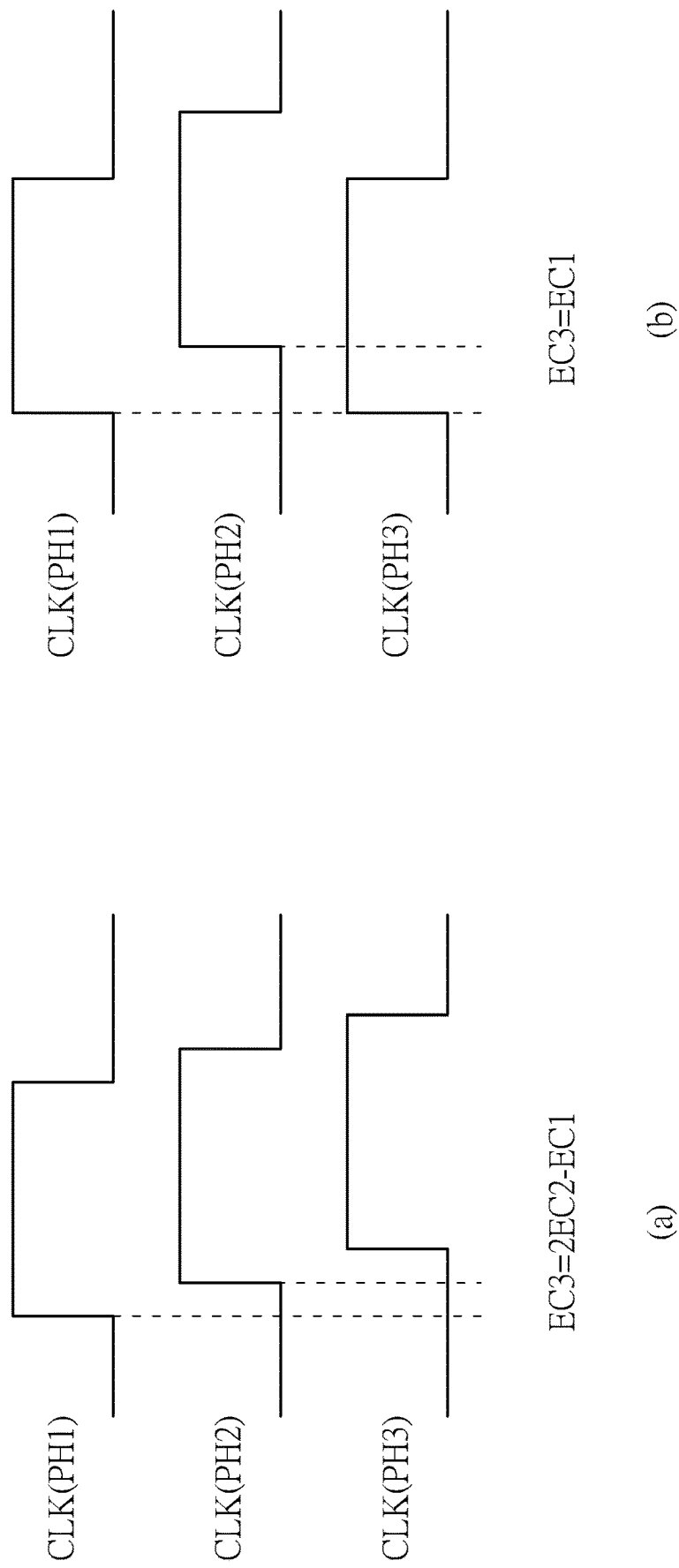
FIG. 3 shows determining the updated tap coefficients by referring to directions of two phase-adjustments of the clock signal.

Then, after the minimum delay time TR, when the echo-cancellation circuit 126 starts processing the fifth block, the control circuit 124 checks whether the phase of the clock signal CLK needs to be adjusted. If the phase of the clock signal CLK needs to be adjusted, the control circuit 124 records the plurality of tap coefficients currently used by the echo-cancellation circuit 126 as a plurality of second tap coefficients EC2, and then the control circuit 124 generates the control signal Vc1 to the clock generating circuit 128 to adjust the phase of the clock signal CLK. At this time, the control circuit 124 generates a plurality of updated tap coefficients EC3 according to the directions of the two phase-adjustments and the recorded first tap coefficients EC1 and/or second tap coefficients EC2, for use of the echo-cancellation circuit 126. Specifically, referring to FIG. 3, it is assumed that CLK (PH1), CLK (PH2), and CLK (PH3) represent the phase of the clock signal CLK before the first phase adjustment, after the first phase adjustment, and after the second phase adjustment, respectively. Then, in FIG. 3(a), since the clock signal CLK has the same direction in the two phase-adjustments, the control circuit 124 extrapolates the first tap coefficients EC1 and the second tap coefficients EC2 to generate updated tap coefficients EC3, that is EC3=2*EC2−EC1. On the other hand, in FIG. 3 (b), because the direction of the first phase adjustment is different from that of the direction of the second phase adjustment, the control circuit 124 directly uses the first tap coefficients EC1 as the updated tap coefficient EC3.

As described above, since the control circuit 124 predicts the updated tap coefficients required later based on the plurality of tap coefficients previously used by the echo-cancellation circuit 126, and these updated tap coefficients can be used by the echo-cancellation circuit 126 at an appropriate time, the problem of poor signal quality caused by the fact that the tap coefficients of the echo-cancellation circuit 126 cannot be quickly updated to the appropriate values after the phase of the clock signal CLK is adjusted can be effectively avoided. In addition, "Td" shown in FIG. 2 represents the time that the noise caused by the phase adjustment of the clock signal CLK affects the echo-cancellation circuit 126, that is, the echo-cancellation circuit 126 can use the updated tap coefficients EC3 calculated by the control circuit 124 to perform the echo-cancellation operation after a period of time "Td" after the phase the clock signal CLK is adjusted.

It is noted that after the echo-cancellation circuit 126 uses the updated tap coefficient EC3 calculated by the control circuit 124 to perform the echo-cancellation operation, the echo-cancellation circuit 126 will still use its adaptive algorithm to further update and adjust the internal tap coefficients, for effectively performing the echo-cancellation of the digital input signal Din.

Figure 4:
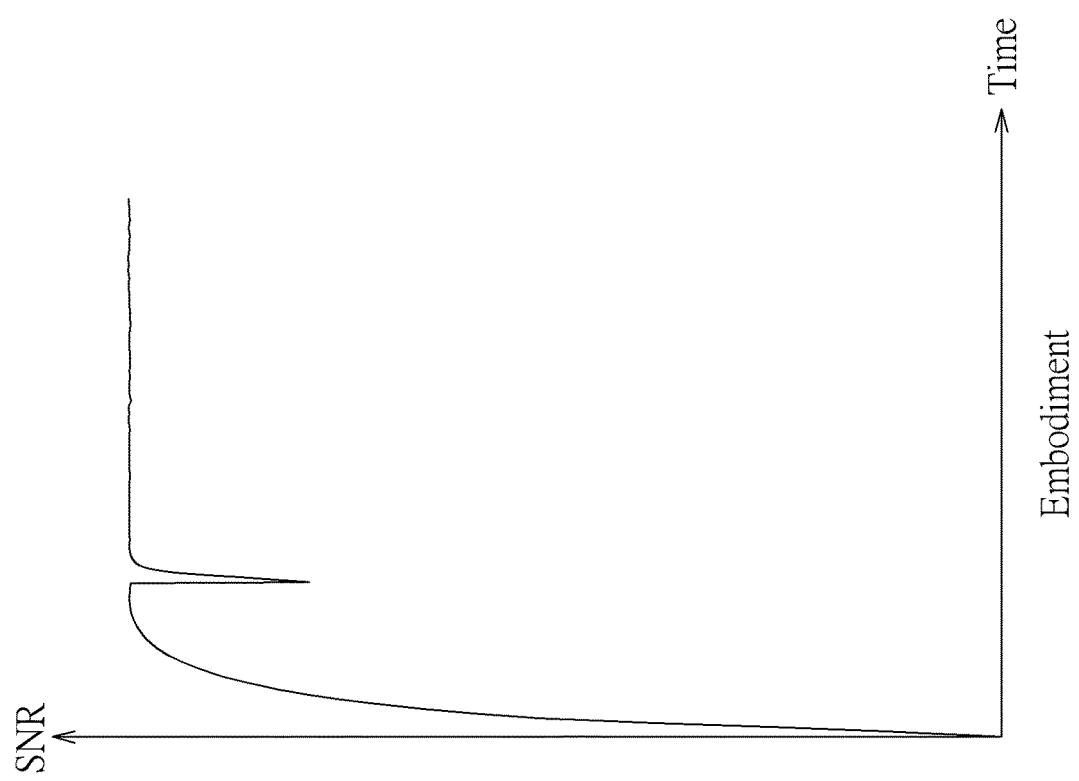
FIG. 4 shows a comparison between the present embodiment and the prior art in signal-to-noise ratios (SNR).
Figure 4:
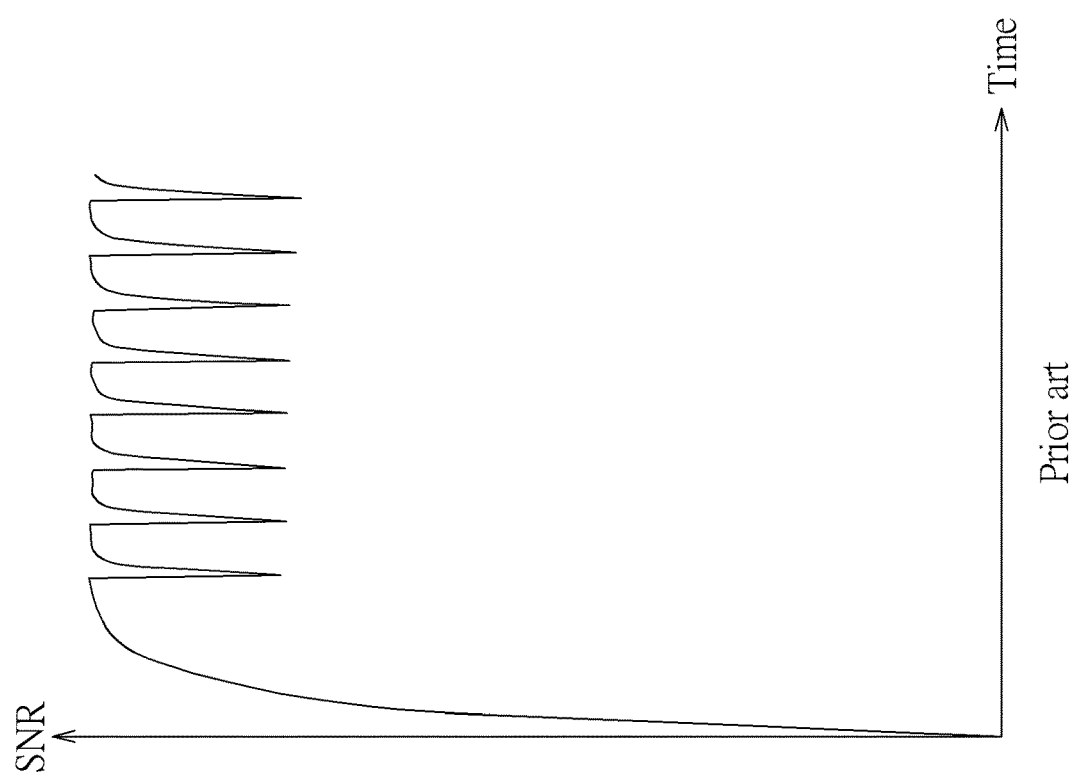

FIG. 4 shows a comparison between the present embodiment and the prior art in SNR. As shown in FIG. 4, in the prior art, each phase adjustment of the clock signal CLK will degrade the SNR of the output signal Vout. In this embodiment, except for the first phase adjustment of the clock signal CLK, the phase adjustments of the clock signal CLK will not affect the SNR of the output signal Vout.

Figure 5:
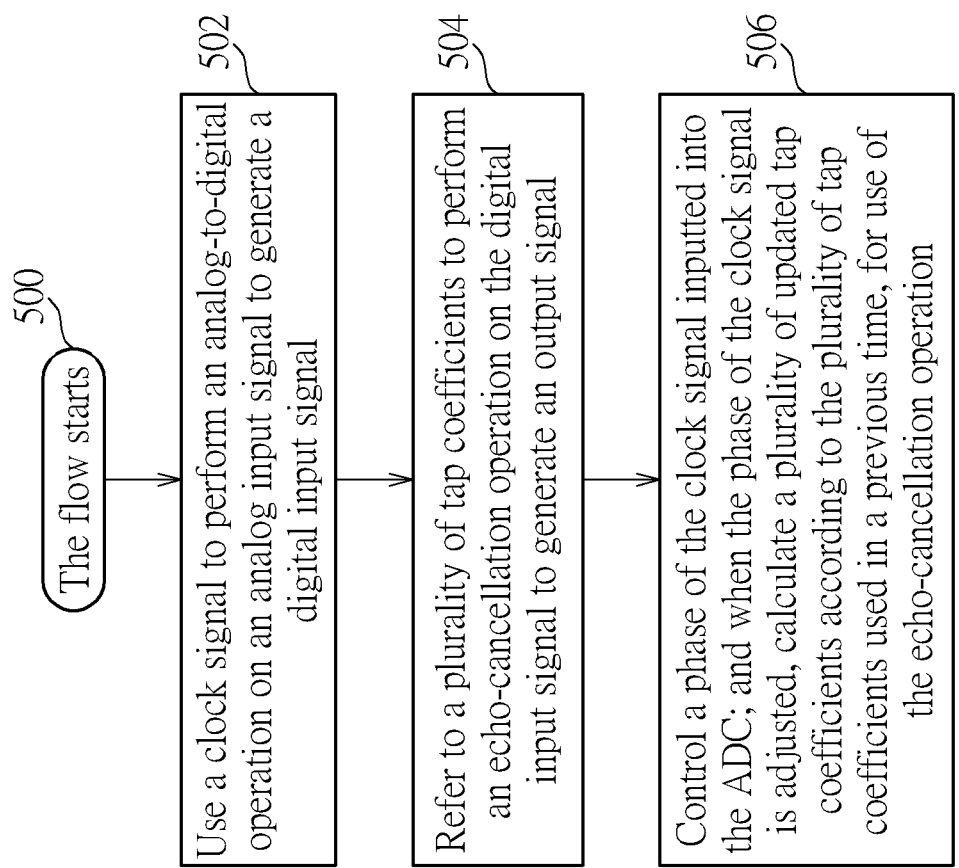
FIG. 5 is a flowchart of a signal processing method according to one embodiment of the present invention.

FIG. 5 is a flowchart of a signal processing method according to one embodiment of the present invention. Referring to the descriptions of the above embodiment, the flow of the signal processing method is as follows.

Step 500: the flow starts.

Step 502: use a clock signal to perform an analog-to-digital operation on an analog input signal to generate a digital input signal.

Step 504: refer to a plurality of tap coefficients to perform an echo-cancellation operation on the digital input signal to generate an output signal.

Step 506: control a phase of the clock signal inputted into the ADC; and when the phase of the clock signal is adjusted, calculate a plurality of updated tap coefficients according to the plurality of tap coefficients used in a previous time, for use of the echo-cancellation operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver, comprising:
an analog-to-digital converter (ADC), configured to use a clock signal to perform an analog-to-digital converting operation on an analog input signal to generate digital input signal;
an echo-cancellation circuit, coupled to the ADC, configured to refer to a plurality of tap coefficients to perform an echo-cancellation operation on the digital input signal to generate an output signal; and
a control circuit, coupled to the ADC and the echo-cancellation circuit, configured to control a phase of the clock signal inputted into the ADC;
and when the phase of the clock signal is adjusted, the control circuit calculates a plurality of updated tap coefficients by only using the plurality of tap coefficients used by the echo-cancellation circuit in a previous time, for use of the echo-cancellation circuit.

2. The receiver of claim 1, wherein the control circuit calculates the plurality of updated tap coefficients based on the plurality of tap coefficients used by the echo-cancellation circuit at least one of previous two time points, for use of the echo-cancellation circuit.

3. The receiver of claim 2, wherein the previous two time points correspond to two phase adjustments of the clock signal, respectively.

4. The receiver of claim 3, wherein the control circuit calculates the plurality of updated tap coefficients based on directions of the two phase adjustments of the clock signal and the plurality of tap coefficients used by the echo-cancellation circuit at the at least one of the previous two time points, for use of the echo-cancellation circuit.

5. The receiver of claim 4, wherein when the directions of the two phase adjustments of the clock signal are the same, the control circuit calculates the plurality of updated tap coefficients by extrapolating the plurality of tap coefficients used by the echo-cancellation circuit at the previous two time points.

6. The receiver of claim 4, wherein when the directions of the two phase adjustments of the clock signal are different, the control circuit directly uses the plurality of tap coefficients used by the echo-cancellation circuit at the earlier time point of the two time points as the plurality of updated tap coefficients.

7. The receiver of claim 4, wherein when the clock signal needs a first phase adjustment, the control circuit records the plurality of tap coefficients currently used by the echo-cancellation circuit as a plurality of first tap coefficients, then the control circuit adjusts the phase of the clock signal; and
when the clock signal needs a second phase adjustment, the control circuit records the plurality of tap coefficients currently used by the echo-cancellation circuit as a plurality of second tap coefficients, then the control circuit calculates the plurality of updated tap coefficients based on the plurality of first tap coefficients and the plurality of second tap coefficients, for use in the echo-cancellation circuit after the clock signal has the second phase adjustment.

8. The receiver of claim 7, wherein when directions of the first phase adjustment and the second phase adjustment are the same, the control circuit extrapolating the plurality of first tap coefficients and the plurality of second tap coefficients to generate the plurality of updated coefficients; and when the directions of the first phase adjustment and the second phase adjustment are different, the control circuit directly uses the plurality of first tap coefficients as the plurality of updated tap coefficients.

9. A signal processing method, comprising:
using a clock signal to perform an analog-to-digital converting operation on an analog input signal to generate a digital input signal;
referring to a plurality of tap coefficients to perform an echo-cancellation operation on the digital input signal to generate an output signal;
controlling a phase of the clock signal inputted into the ADC; and
when the phase of the clock signal is adjusted, calculating a plurality of updated tap coefficients by only using the plurality of tap coefficients used in a previous time, for use of the echo-cancellation operation.

10. The signal processing method of claim 9, wherein the step of when the phase of the clock signal is adjusted, calculating the plurality of updated tap coefficients according to the plurality of tap coefficients used in the previous time comprises:
calculating the plurality of updated tap coefficients based on the plurality of tap coefficients used in the echo-cancellation operation at least one of previous two time points, for use of the echo-cancellation operation.

11. The signal processing method of claim 10, wherein the previous two time points correspond to two phase adjustments of the clock signal, respectively.

12. The signal processing method of claim 11, wherein the control circuit calculates the plurality of updated tap coefficients based on directions of the two phase adjustments of the clock signal and the plurality of tap coefficients used by the echo-cancellation circuit at the at least one of the previous two time points, for use of the echo-cancellation operation.

13. The signal processing method of claim 12, wherein the step of when the phase of the clock signal is adjusted, calculating the plurality of updated tap coefficients according to the plurality of tap coefficients used in the previous time comprises:
when the directions of the two phase adjustments of the clock signal are the same, calculating the plurality of updated tap coefficients by extrapolating the plurality of tap coefficients used in the echo-cancellation operation at the previous two time points.

14. The signal processing method of claim 12, wherein the step of when the phase of the clock signal is adjusted, calculating the plurality of updated tap coefficients according to the plurality of tap coefficients used in the previous time comprises:
when the directions of the two phase adjustments of the clock signal are different, directly using the plurality of tap coefficients used in the echo-cancellation operation at the earlier time point of the two time points as the plurality of updated tap coefficients.

15. The signal processing method of claim 12, wherein the step of when the phase of the clock signal is adjusted, calculating the plurality of updated tap coefficients according to the plurality of tap coefficients used in the previous time comprises:
when the clock signal needs a first phase adjustment, recording the plurality of tap coefficients currently used in the echo-cancellation operation as a plurality of first tap coefficients, then changing the phase of the clock signal; and
when the clock signal needs a second phase adjustment, recording the plurality of tap coefficients currently used in the echo-cancellation operation as a plurality of second tap coefficients, then calculating the plurality of updated tap coefficients based on the plurality of first tap coefficients and the plurality of second tap coefficients, for use in the echo-cancellation operation after the clock signal has the second phase adjustment.

16. The signal processing method of claim 15, wherein when directions of the first phase adjustment and the second phase adjustment are the same, the plurality of updated coefficients are calculated by extrapolating the plurality of first tap coefficients and the plurality of second tap coefficients; and when the directions of the first phase adjustment and the second phase adjustment are different, directly using the plurality of first tap coefficients as the plurality of updated tap coefficients.

17. The receiver of claim 7, wherein when directions of the first phase adjustment and the second phase adjustment are the same, the control circuit uses a formula "EC3=2\*EC2−EC1" to calculate the plurality of updated coefficients, wherein "EC3" represents each of the updated coefficient, "EC2" represents each of the second tap coefficients, and "EC1" represents each of the first tap coefficients.

18. The signal processing method of claim 15, wherein when directions of the first phase adjustment and the second phase adjustment are the same, using a formula "EC3=2\*EC2−EC1" to calculate the plurality of updated coefficients, wherein "EC3" represents each of the updated coefficient, "EC2" represents each of the second tap coefficients, and "EC1" represents each of the first tap coefficients.

\* \* \* \* \*